(12) United States Patent
Jain et al.

(10) Patent No.: US 11,799,021 B2
(45) Date of Patent: Oct. 24, 2023

(54) LATERAL BIPOLAR TRANSISTOR STRUCTURE WITH MARKER LAYER FOR EMITTER AND COLLECTOR

(71) Applicant: GlobalFoundries U.S. Inc., Malta, NY (US)

(72) Inventors: Vibhor Jain, Clifton Park, NY (US); Alexander M. Derrickson, Saratoga Springs, NY (US); Judson R. Holt, Ballston Lake, NY (US)

(73) Assignee: GLOBALFOUNDRIES U.S. Inc., Malta, NY (US)

( * ) Notice: Subject to any disclaimer, the term of this patent is extended or adjusted under 35 U.S.C. 154(b) by 28 days.

(21) Appl. No.: 17/450,842

(22) Filed: Oct. 14, 2021

(65) Prior Publication Data
US 2023/0058451 A1  Feb. 23, 2023

Related U.S. Application Data

(60) Provisional application No. 63/235,919, filed on Aug. 23, 2021.

(51) Int. Cl.
| | |
|---|---|
| *H01L 29/735* | (2006.01) |
| *H01L 29/08* | (2006.01) |
| *H01L 27/12* | (2006.01) |
| *H01L 29/66* | (2006.01) |
| *H01L 29/06* | (2006.01) |

(52) U.S. Cl.
CPC ........ *H01L 29/735* (2013.01); *H01L 27/1203* (2013.01); *H01L 29/0649* (2013.01); *H01L 29/0808* (2013.01); *H01L 29/0821* (2013.01); *H01L 29/6625* (2013.01)

(58) Field of Classification Search
CPC ............... H01L 27/067; H01L 27/0722; H01L 27/0783; H01L 29/0808; H01L 29/6625; H01L 27/07229; H01L 29/1008; H01L 29/735; H01L 29/7393
See application file for complete search history.

(56) References Cited

U.S. PATENT DOCUMENTS

| | | | |
|---|---|---|---|
| 6,949,764 B2 | 9/2005 | Ning | |
| 8,288,758 B2 | 10/2012 | Ning et al. | |
| 8,420,493 B2 | 4/2013 | Ning et al. | |
| 8,558,282 B1 * | 10/2013 | Cai .................. | H01L 29/161 257/E21.372 |
| 8,586,441 B1 | 11/2013 | Cai et al. | |
| 9,536,788 B1 | 1/2017 | Ning et al. | |

(Continued)

*Primary Examiner* — Wasiul Haider
(74) *Attorney, Agent, or Firm* — Francois Pagette; Hoffman Warnick LLC

(57) ABSTRACT

Embodiments of the disclosure provide a lateral bipolar transistor structure with a marker layer for emitter and collector terminals. A lateral bipolar transistor structure according to the disclosure includes a semiconductor layer over an insulator layer. The semiconductor layer includes an emitter/collector (E/C) region having a first doping type and an intrinsic base region adjacent the E/C region and having a second doping type opposite the first doping type. A marker layer is on the E/C region of the semiconductor layer, and a raised E/C terminal is on the marker layer. An extrinsic base is on the intrinsic base region of the semiconductor layer, and a spacer is horizontally between the raised E/C terminal and the extrinsic base.

20 Claims, 18 Drawing Sheets

(56) References Cited

U.S. PATENT DOCUMENTS

| | | | |
|---|---|---|---|
| 10,825,921 B2 | 11/2020 | Balakrishnan et al. | |
| 2002/0030199 A1* | 3/2002 | Hirano | H01L 29/7416 257/107 |
| 2014/0088401 A1* | 3/2014 | Cai | H01L 31/1105 600/407 |
| 2016/0300935 A1* | 10/2016 | Cai | H01L 29/0821 |
| 2017/0092749 A1* | 3/2017 | Cai | H01L 29/737 |

* cited by examiner

LATERAL BIPOLAR TRANSISTOR STRUCTURE WITH MARKER LAYER FOR EMITTER AND COLLECTOR

BACKGROUND

1. Technical Field

The present disclosure provides a lateral bipolar structure transistor with a marker layer for an emitter/collector (E/C) of the transistor.

2. Background Art

Present technology is at atomic level scaling of certain micro-devices such as logic gates, bipolar transistors, field effect transistors (FETs), and capacitors. Circuit chips with millions of such devices are common. The structure of a lateral bipolar transistor defines several of its properties during operation. Conventional integrated circuits may employ vertical bipolar transistors, but these types of devices may have higher costs and/or operational parameters that do not meet certain constraints. Lateral bipolar transistors may not carry these concerns but may be difficult to form in some settings (e.g., precise base thickness and width control on semiconductor on insulator (SOI) layers). This challenge may be especially pronounced where insulative material(s) is used to control etching which may interfere with the performance of the eventual bipolar transistor.

SUMMARY

The illustrative aspects of the present disclosure are designed to solve the problems herein described and/or other problems not discussed.

Embodiments of the disclosure provide a bipolar transistor structure including: a semiconductor layer over an insulator layer, the semiconductor layer including: an emitter/collector (E/C) region having a first doping type, and an intrinsic base region adjacent the E/C region and having a second doping type opposite the first doping type; a marker layer on the E/C region of the semiconductor layer; a raised E/C terminal on the marker layer; an extrinsic base on the intrinsic base region of the semiconductor layer; and a spacer horizontally between the raised E/C terminal and the extrinsic base.

Additional embodiments of the disclosure provide a lateral bipolar transistor structure including: a semiconductor on insulator (SOI) layer on a buried insulator layer and adjacent a trench isolation (TI); a semiconductor stack on a first portion of the SOI layer, the semiconductor stack including a first marker layer, a doped semiconductor layer on the first marker layer, and a second marker layer on the doped semiconductor layer; a raised E/C terminal on the semiconductor stack; a base terminal on a second portion of the SOI layer, the base terminal including an intrinsic base region on the SOI layer and an extrinsic base region on the intrinsic base region; and a spacer horizontally between the raised E/C terminal and the extrinsic base region of the base terminal.

Further embodiments of the disclosure provide a method of forming a lateral bipolar transistor structure, the method including: forming an emitter/collector (E/C) region having a first doping type in a first portion of a semiconductor layer; forming an intrinsic base region in a second portion of the semiconductor layer adjacent the E/C region, the intrinsic base region having a second doping type opposite the first doping type; forming a marker layer on the E/C region of the semiconductor layer; forming a raised E/C terminal over the marker layer; forming an extrinsic base on the intrinsic base region of the semiconductor layer; and forming a spacer horizontally between the raised E/C terminal and the extrinsic base.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which.

Figure 1:
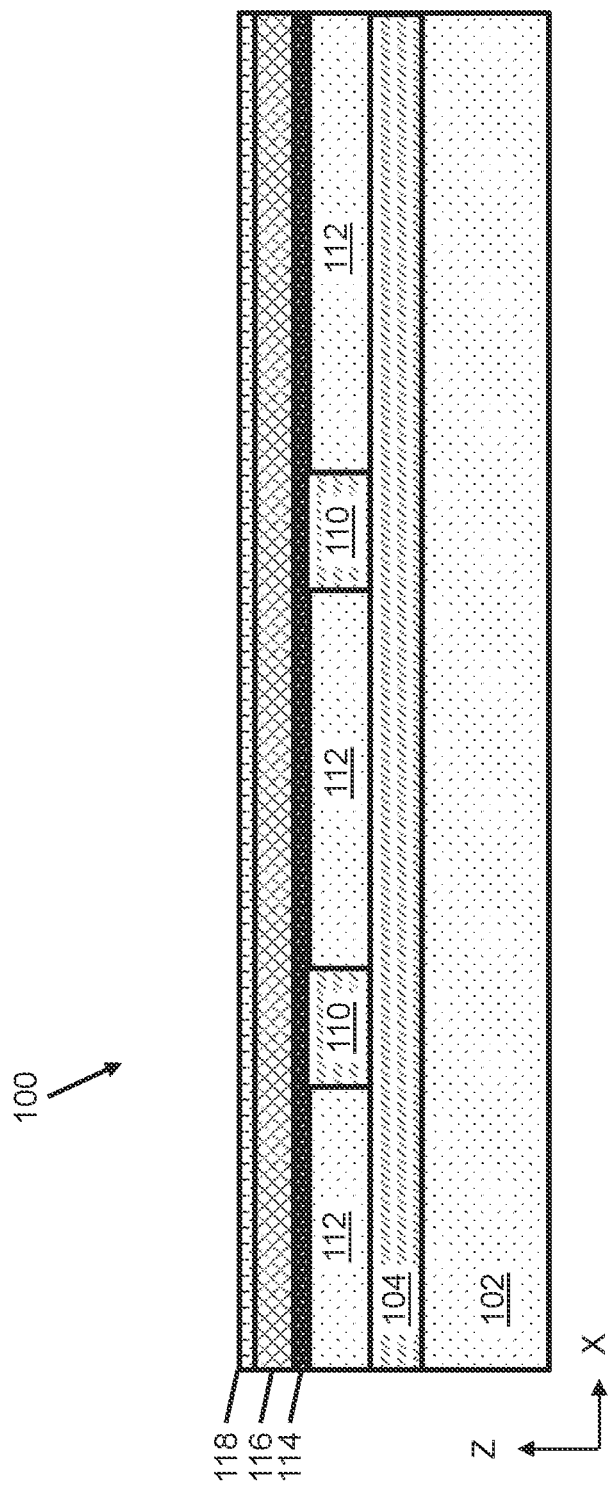
FIG. 1 depicts a cross-sectional view of an initial structure to be processed according to embodiments of the disclosure.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific illustrative embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

It will be understood that when an element such as a layer, region, or substrate is referred to as being "on" or "over" another element, it may be directly on the other element or intervening elements may also be present. In contrast, when an element is referred to as being "directly on" or "directly over" another element, there may be no intervening elements present. It will also be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present.

Reference in the specification to "one embodiment" or "an embodiment" of the present disclosure, as well as other variations thereof, means that a particular feature, structure, characteristic, and so forth described in connection with the embodiment is included in at least one embodiment of the present disclosure. Thus, the phrases "in one embodiment" or "in an embodiment," as well as any other variations appearing in various places throughout the specification are not necessarily all referring to the same embodiment. It is to be appreciated that the use of any of the following "/," "and/or," and "at least one of," for example, in the cases of "A/B," "A and/or B" and "at least one of A and B," is intended to encompass the selection of the first listed option (a) only, or the selection of the second listed option (B) only, or the selection of both options (A and B). As a further example, in the cases of "A, B, and/or C" and "at least one of A, B, and C," such phrasing is intended to encompass the first listed option (A) only, or the selection of the second listed option (B) only, or the selection of the third listed option (C) only, or the selection of the first and the second listed options (A and B), or the selection of the first and third listed options (A and C) only, or the selection of the second and third listed options (B and C) only, or the selection of all three options (A and B and C). This may be extended, as readily apparent by one of ordinary skill in the art, for as many items listed.

Embodiments of the disclosure provide a lateral bipolar transistor structure with one or more marker layers (e.g., silicon germanium (SiGe) and/or other materials capable of detection when etched) on an emitter/collector (E/C) region. The term "marker layer," as used herein, may refer to any semiconductor material that, when removed via etching and/or similar techniques, an operator may detect through differences between its material composition and other materials located above and/or below the marker layer. The marker layer, as discussed herein, can be used to control the size, shape, and position of emitter, base, and collector terminals in a bipolar transistor. A bipolar transistor according to the disclosure may have a semiconductor layer over an insulator layer, in which the semiconductor layer includes an E/C region of a first doping type and an intrinsic base region adjacent the E/C region and having a second, opposite polarity doping type. A marker layer is on the E/C region of the semiconductor layer, and a raised E/C terminal formed of doped semiconductor material is on the marker layer. An extrinsic base is on the intrinsic base region of the semiconductor layer. The marker layer may be positioned above and/or at other locations away from the intrinsic base. In this case, the boundary between the extrinsic base and intrinsic base region does not include any part of the marker layer. The marker layer may be absent from this location, e.g., by being previously removed to form and/or dope the intrinsic base region. A spacer is horizontally between the raised E/C terminal and the extrinsic base. The spacer may not be present at the boundary between the intrinsic base region and E/C region of the semiconductor layer, thereby allowing a P-N junction to form between these regions of material.

BJT structures, such as those in embodiments of the disclosure, operate using multiple "P-N junctions." The term "P-N" refers to two adjacent materials having different types of conductivity (i.e., P-type and N-type), which may be induced through dopants within the adjacent material(s). A P-N junction, when formed in a device, may operate as a diode. A diode is a two-terminal element, which behaves differently from conductive or insulative materials between two points of electrical contact. Specifically, a diode provides high conductivity from one contact to the other in one voltage bias direction (i.e., the "forward" direction), but provides little to no conductivity in the opposite direction (i.e., the "reverse" direction). In the case of the P-N junction, the orientation of a diode's forward and reverse directions may be contingent on the type and magnitude of bias applied to the material composition of one or both terminals, which affect the size of the potential barrier. In the case of a junction between two semiconductor materials, the potential barrier will be formed along the interface between the two semiconductor materials.

Referring to FIG. 1, a preliminary structure 100 (simply "structure" hereafter) suitable to form a lateral bipolar transistor structure according to embodiments of the disclosure is shown. Preliminary structure 100 may be processed as described herein to yield one or more lateral BJT structures with a marker layer on doped regions of semiconductor material for defining an E/C region. However, it is understood that other techniques, ordering of processes, etc., may be implemented to yield the same lateral bipolar transistor structure(s) or similar lateral bipolar transistor structures in further embodiments. FIG. 1 shows a cross-sectional view of structure 100 with a substrate 102 including, e.g., one or more semiconductor materials. Substrate 102 may include but is not limited to silicon, germanium, silicon germanium (SiGe), silicon carbide, or any other common IC semiconductor substrates. In the case of SiGe, the germanium concentration in substrate 102 may differ from other SiGe-based structures described herein. A portion or entire semiconductor substrate 102 may be strained.

Substrate 102 optionally may include embedded elements for electrically separating active materials formed thereon from other regions and/or materials within substrate 102. An insulative layer 104 optionally may be formed within substrate 102, e.g., by converting silicon material within substrate 102 into a higher-resistive material such as polycrystalline or amorphous silicon (poly-Si). Insulative layer 104 may extend horizontally throughout substrate 102, and/or may be formed selectively under locations where active materials are formed, examples of which are discussed elsewhere herein. In further implementations, insulative layer 104 may include oxygen doping to form a dielectric insulator or a buried oxide ("BOX") layer underneath substrate 102 and electrically isolate overlying active semiconductor materials. Insulative layer 104 thus may include other elements or molecules such as Ge, N, or Si. However embodied, insulative layer 104 may be sized as narrow as possible to provide better interaction with overlying semiconductor materials, and in various embodiments may have a thickness that is at most approximately five nanometers (nm) to approximately three micron (3 um). Some portions of substrate 102 may not have insulative layer 104, and/or multiple insulator layers 104 may be formed within substrate 102 at different depths. Additionally, various conductive particles ("dopants") may be introduced into substrate 102 via a process known as "pre-doping" of substrate 102 above insulative layer 104.

Embodiments of the disclosure may include forming a set of trench isolations (TIs) 110 by forming and filling trenches (not labeled) with an insulating material such as oxide, to isolate one region of substrate 102 from an adjacent region of substrate 102. Various portions of a lateral bipolar transistor structure, including the active semiconductor materials thereof and/or other devices where applicable, may be disposed within an area of substrate 102 that is isolated by TI(s) 110. According to one example, two TIs 110 are formed, with a semiconductor layer 112 being horizontally between the two TIs 110. Semiconductor layer 112 may be processed via etching, deposition, doping, etc., to form portions of a lateral bipolar transistor. TIs 110 may be formed before active materials are formed within substrate 102, but this is not necessarily true in all implementations.

Each TI 110 may be formed of any currently-known or later developed substance for providing electrical insulation, and as examples may include: silicon nitride ($Si_3N_4$), silicon oxide ($SiO_2$), fluorinated $SiO_2$ (FSG), hydrogenated silicon oxycarbide (SiCOH), porous SiCOH, boro-phospho-silicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, a spin-on silicon-carbon containing polymer material, near frictionless carbon (NFC), or layers thereof. TI(s) 110 and semiconductor layer 112 may be planarized (e.g., by chemical mechanical planarization or other technique(s)) such that the upper surface(s) of semiconductor layer(s) 112 is/are substantially coplanar with the upper surface of adjacent TIs 110.

Structure 100 may include a marker layer 114 on semiconductor layer 112 and TIs 110. The material composition of marker layer 114 may include silicon germanium (SiGe) in the case where semiconductor layer(s) 112 include other Si-based materials such as single-crystal silicon, etc. Marker layer 114 may be formed by epitaxial growth, in which case the crystallographic orientation of marker layer 114 may replicate the crystallographic properties of the underlying material. For instance, marker layer 114 may be a single crystal semiconductor layer where it is formed on semiconductor layer 112 (e.g., due to the single crystal structure thereof). Other portions of marker layer 114 may include polycrystalline semiconductor material in areas formed on TI(s) 110 (e.g., due to the insulative composition thereof). Such differences are not explicitly shown in marker layer 114 but may arise at positions over TI(s) 110 and semiconductor layer 112. As discussed herein, the etch selectivity and/or other properties of marker layer 114 may prevent marker layer 114 from being removed by the same etchant(s) and/or other techniques for removing materials above marker layer 114 or below marker layer 114. Marker layer 114 thus may be used to control the position of subsequently formed structures and/or materials such as the base, emitter, and/or collector of a lateral bipolar transistor structure.

Structure 100 also may include a raised semiconductor layer 116 over marker layer 114. Raised semiconductor layer 116 may include a same or similar semiconductor material as those described herein regarding substrate 102 and/or semiconductor layer(s) 112, but with a distinct doping profile (i.e., polarity and concentration). For instance, raised semiconductor layer 116 may be pre-doped or doped in situ to have N-type dopants for use in E/C terminals of an eventual lateral bipolar transistor structure. Subsequent processing may remove portions of raised semiconductor layer 116 to define multiple emitter and/or collector terminals. An insulative cap 118 including, e.g., one or more nitride insulators (e.g., silicon nitride (SiN)) and/or other dielectric materials, may be on raised semiconductor layer 116 and may define an uppermost layer of structure 100. Insulative cap 118 may take the form of a "pad nitride" structured for allowing masking material(s) to be formed thereon for targeting, removing, and/or otherwise processing selected portions of structure 100.

Figure 2:
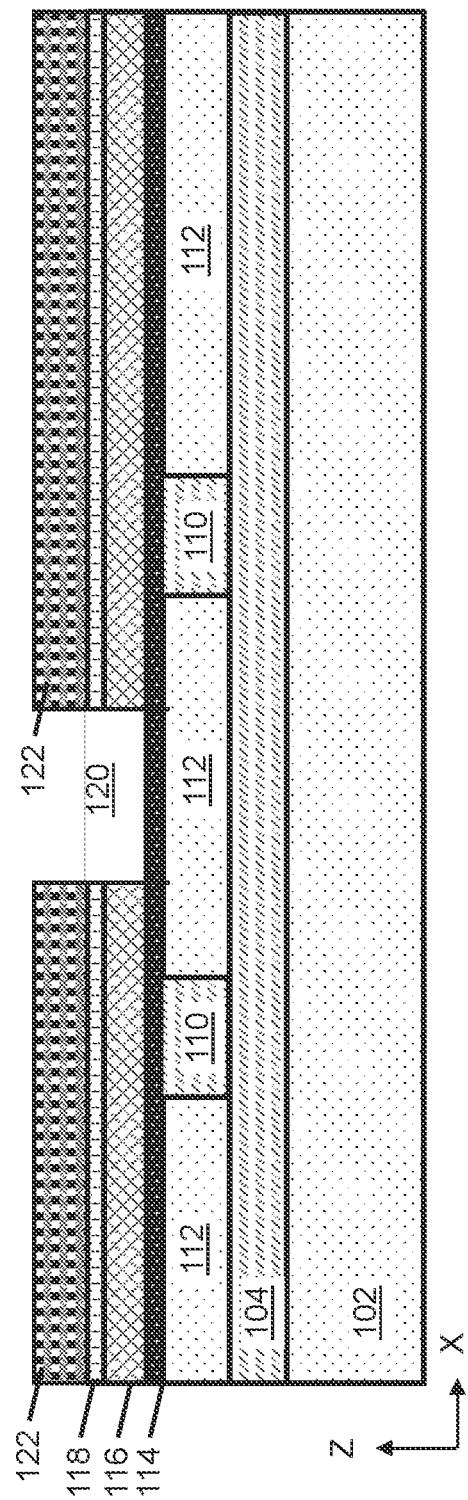
FIG. 2 depicts a cross-sectional view of forming an opening in the structure through a marker layer according to embodiments of the disclosure.
Figure 3:
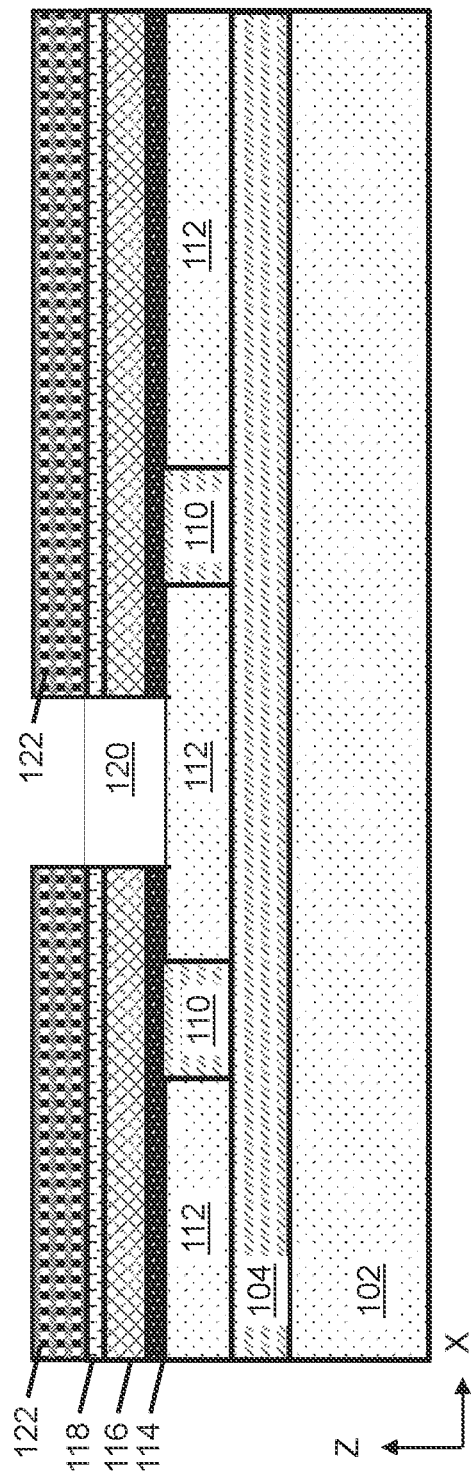
FIG. 3 depicts a cross-sectional view of removing a portion of a marker layer according to embodiments of the disclosure.

Referring now to FIGS. 2-3, embodiments of the disclosure may include removing portions of marker layer 114, raised semiconductor layer 116, and insulative cap 118 to form an opening 120, thereby exposing semiconductor layer(s) 112. This removal process may include, for example, forming a mask 122 patterned to expose selected portion(s) of insulative cap 118. Mask 122 may include any now known or later developed appropriate masking material, e.g., a nitride hard mask. As shown in FIG. 2, any appropriate etching process, e.g., a reactive ion etch (ME), can remove insulative cap 118 and raised semiconductor layer 116 to create opening(s) 120, initially to expose marker layer 114. The material composition of marker layer 114 may have a higher etch selectivity than raised semiconductor layer 116 thereover. Thus, a fabricator can detect when raised semiconductor layer 116 is removed and marker layer 114 is exposed. For example, a trace signal, e.g., optical emission signal, will be used to clearly identify the marker layer during the etching process, indicating a stop to the etching process. Accordingly, the marker layer 114, e.g., SiGe material, will provide a signal that can be used as a robust endpoint signal to control the etch of layer 116. The process can be carried out at any location over semiconductor layer(s) 112 where a lateral bipolar transistor structure is desired.

Turning to FIG. 3, continued processing may include increasing the depth of opening(s) 120 by removing marker layer 114 to expose semiconductor layer(s) 112. During the initial forming of opening(s) 120, marker layer 114 may function as an etch stop layer to control the depth of opening 120 and prevent some portions of semiconductor layer(s) 112 from being prematurely removed. Continued etching via RIE, or selective etching processes to remove SiGe or other material(s) within marker layer 114, may be implemented to remove portions of marker layer 114 within opening 120. Opening 120, by exposing semiconductor layer(s) 112, allows various portions of a bipolar transistor base to be formed on semiconductor layer(s) 112 and over insulative layer 104.

Figure 4:
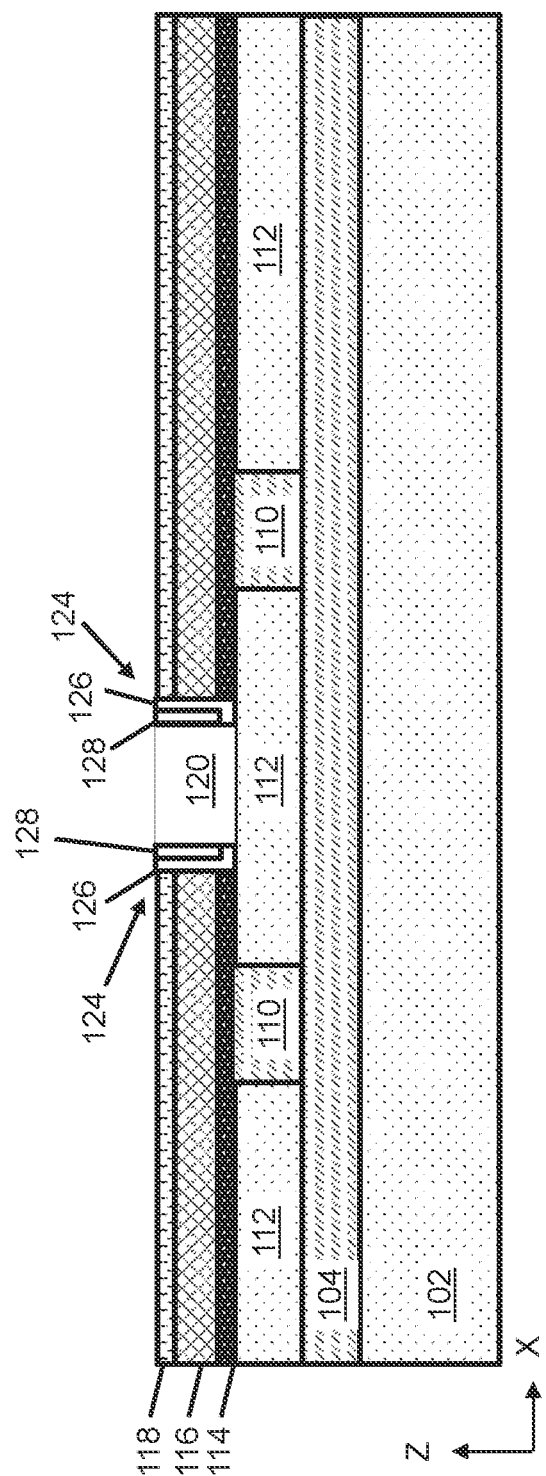
FIG. 4 depicts a cross-sectional view of forming a spacer within the opening according to embodiments of the disclosure.

FIG. 4 depicts removing mask 122 and forming a set of spacers 124 within opening 120 alongside remaining portions of marker layer 114, raised semiconductor layer 116, and insulative cap 118. Spacer(s) 124 can be provided as one or more bodies of insulating material formed on sidewalls of exposed material(s), e.g., by deposition, thermal growth, etc., to electrically and physically insulate materials subsequently formed in opening 120 from other components. In an example embodiment, spacer(s) 124 may be a dual layer spacer including a first spacer 126 having a first composition (e.g., an oxide layer) and a second spacer 128 having a second, different composition (e.g., a nitride layer such as silicon nitride (SiN)) different from first spacer 126. First spacer 126 and second spacer 128 each may be formed by depositing the corresponding spacer material, and then etching back the material (e.g., to re-expose semiconductor layer 112). In some implementations, spacer(s) 124 may include a single layer or more than two layers. For clarity of illustration, first spacer 126 and second spacer 128 are depicted collectively in subsequent FIGS. as spacer(s) 124.

Figure 5:
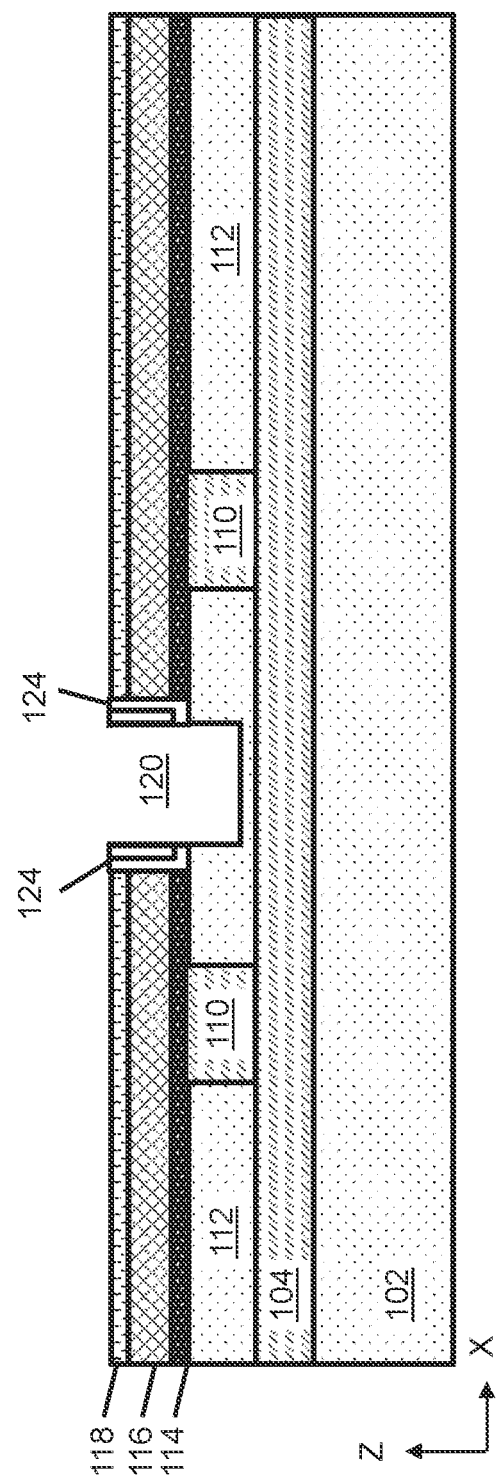
FIG. 5 depicts a cross-sectional view of increasing a depth of the opening according to embodiments of the disclosure.

Turning now to FIG. 5, further processing may include further deepening opening 120 to remove a portion of substrate 102 thereunder. Portions of substrate 102 may be removed, e.g., using RIE over a predetermined amount of time to avoid exposing insulative layer 104 thereunder. The earlier use of marker layer 114 can prevent the previously formed spacer(s) 124 from being within or alongside remaining portions of substrate 102. After portions of substrate 102 are removed to increase the size of opening 120, subsequent processing may include forming the base terminal of a bipolar transistor within opening 120.

Figure 6:
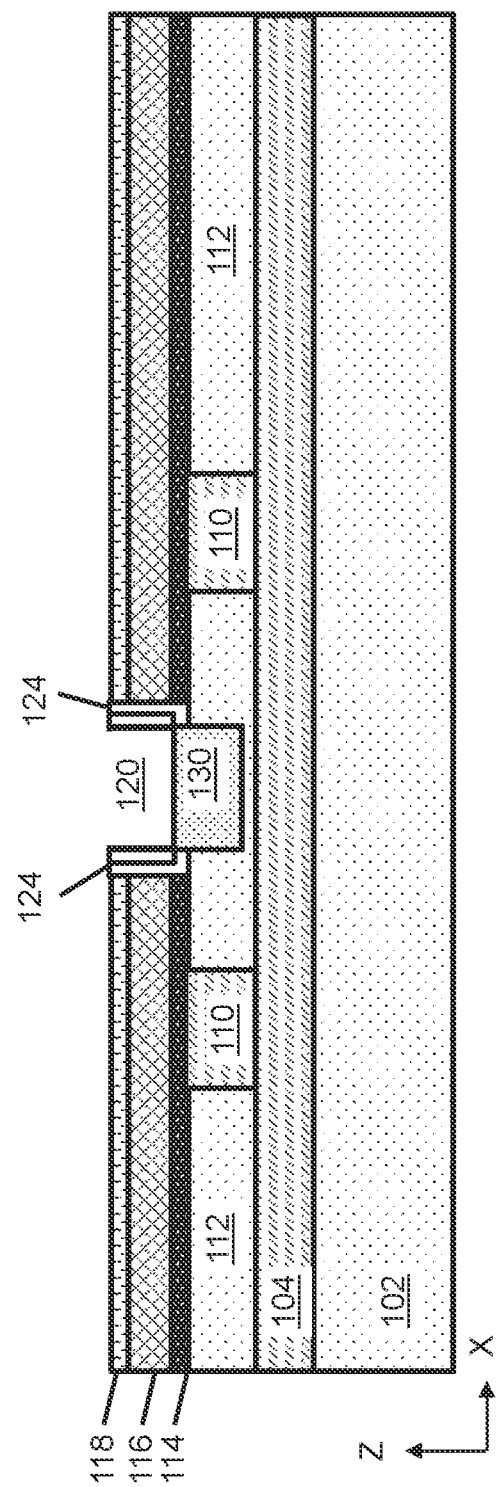
FIG. 6 depicts a cross-sectional view of forming an intrinsic base region according to embodiments of the disclosure.

FIG. 6 depicts forming an intrinsic base 130 within opening 120. Intrinsic base 130 may be formed, e.g., by selective epitaxial growth on semiconductor layer 112 to a desired height, such that opening 120 is only partially filled with intrinsic base 130. Intrinsic base 130 may include the same and/or different semiconductor materials as those within raised semiconductor layer 116 and may have an opposite doping type with respect to raised semiconductor layer 116. For instance, intrinsic base 130 may be P-type when raised semiconductor layer 116 is N-type or vice versa. Intrinsic base 130, however, may have a dopant concentration that is greater than substrate 102. Intrinsic base 130 may have an upper surface that is slightly above, or otherwise substantially coplanar with, a lower surface of spacer(s) 124. The remaining layer 112 below intrinsic base 130 may also be doped to have the same dopant type as intrinsic base 130. Layer 130 can consist of, for example, a SiGe layer (with Ge concentration ranging from 0% to 50%) and carbon doping to control p-type dopant diffusion under subsequent anneals. Intrinsic base 130 can have either a constant Ge concentration throughout or a graded profile with Ge conc. changing from 0% to 50%

Figure 7:
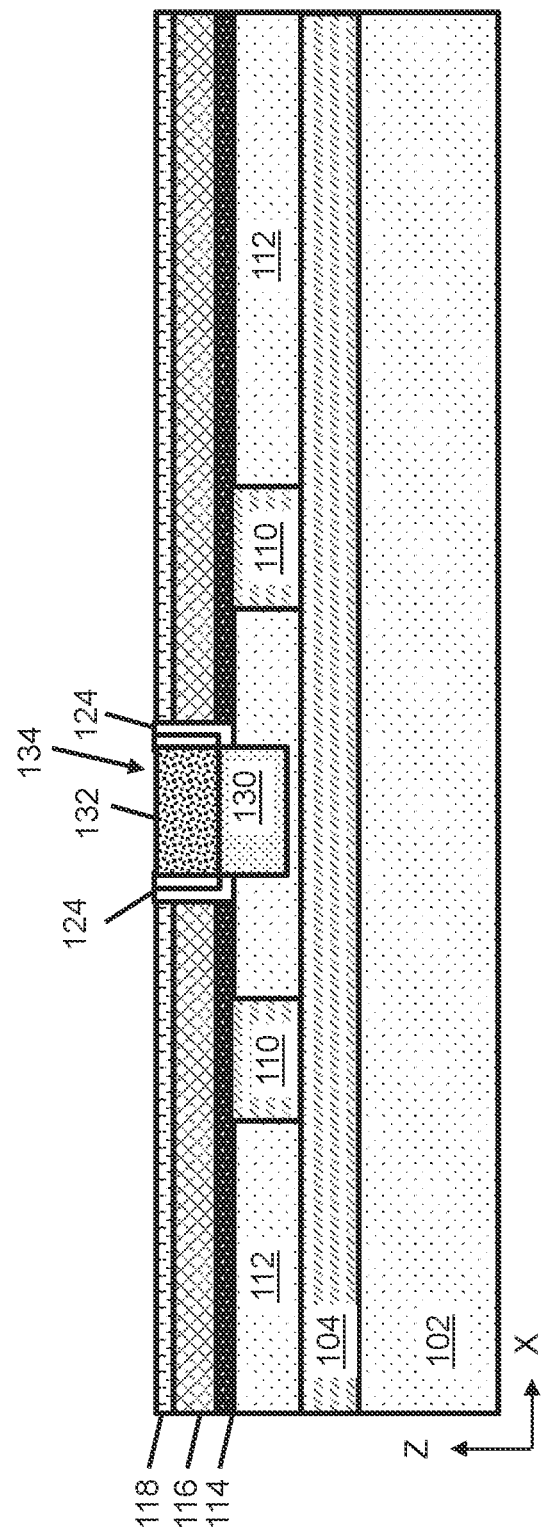
FIG. 7 depicts a cross-sectional view of forming an extrinsic base region on the intrinsic base region according to embodiments of the disclosure.

FIG. 7 depicts the forming of an extrinsic base 132 on intrinsic base 130 to define the remaining portions of a base structure 134. Extrinsic base 132 may be formed by deposition and/or epitaxial growth of silicon and/or other semiconductor materials within opening 120 (FIGS. 2-6) and may be of the same doping type as intrinsic base 130 thereunder. Extrinsic base 132 can be formed for example by selectively growing silicon material above the intrinsic base 130. Extrinsic base 132, however, may have a higher concentration of dopants than intrinsic base 130. The higher doping concentration in extrinsic base 132 may increase electrical conductivity between base structure 134 and any overlying contacts for controlling the flow of current through the eventual lateral bipolar transistor structure. Despite the higher concentration of dopants, extrinsic base 132 may have the same material composition as intrinsic base 130 (e.g., silicon, SiGe, or a combination of two, and/or other semiconductor material and may contain carbon doping). When extrinsic base 132 is formed by deposition or non-selective growth, it may be planarized by use of chemical mechanical planarization (CMP) such that its upper surface is substantially coplanar with adjacent insulative cap(s) 118.

Figure 8:
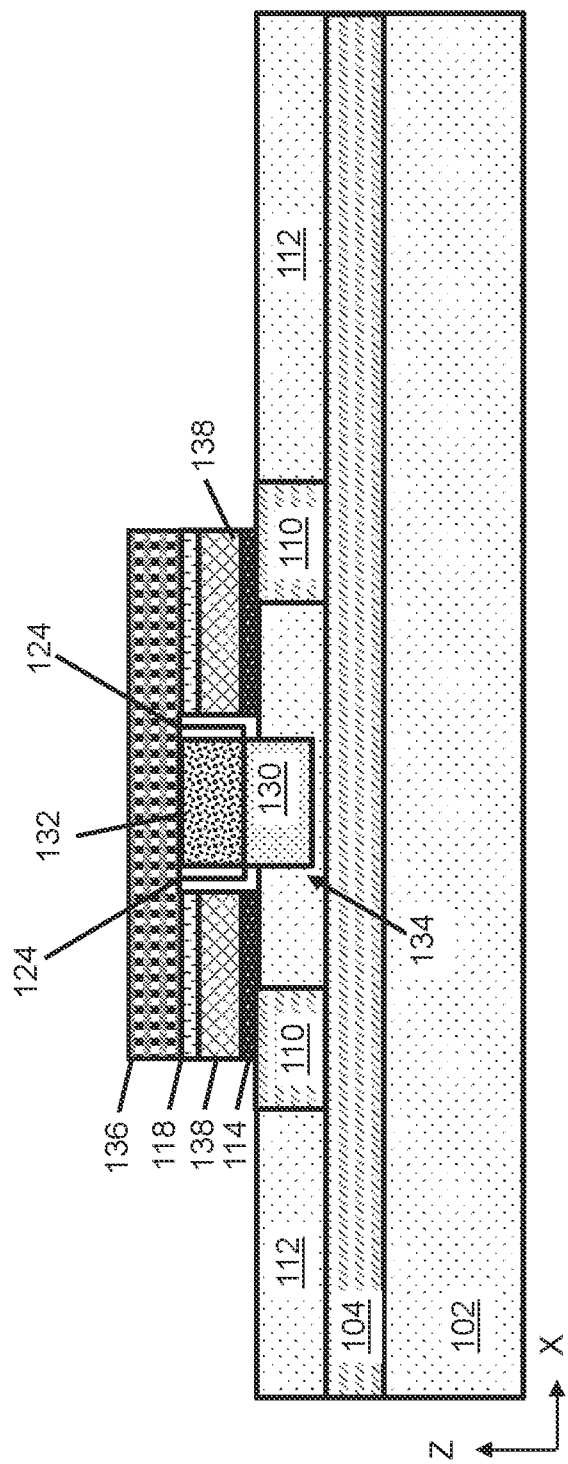
FIG. 8 depicts forming emitter and collector terminals according to embodiments of the disclosure.

Turning to FIG. 8, further processing may define the emitter and collector terminals of a lateral bipolar transistor structure. For example, a mask 136 can be formed over insulative cap(s) 118 and base structure 134 to a desired horizontal width. Thereafter, portions of marker layer 114, raised semiconductor layer 116 (FIGS. 1-7) and insulative cap(s) 118 can be removed (e.g., by etching) to expose TI(s) 110 and semiconductor layer(s) 112 thereunder. Here, as in other processing stages, marker layer 114 may function as an etch stop layer to control the depth to which materials not under mask 136 are removed. The remaining portion(s) of raised semiconductor layer 116 may define a set of raised E/C terminals 138 for the eventual lateral bipolar transistor structure.

Figure 9:
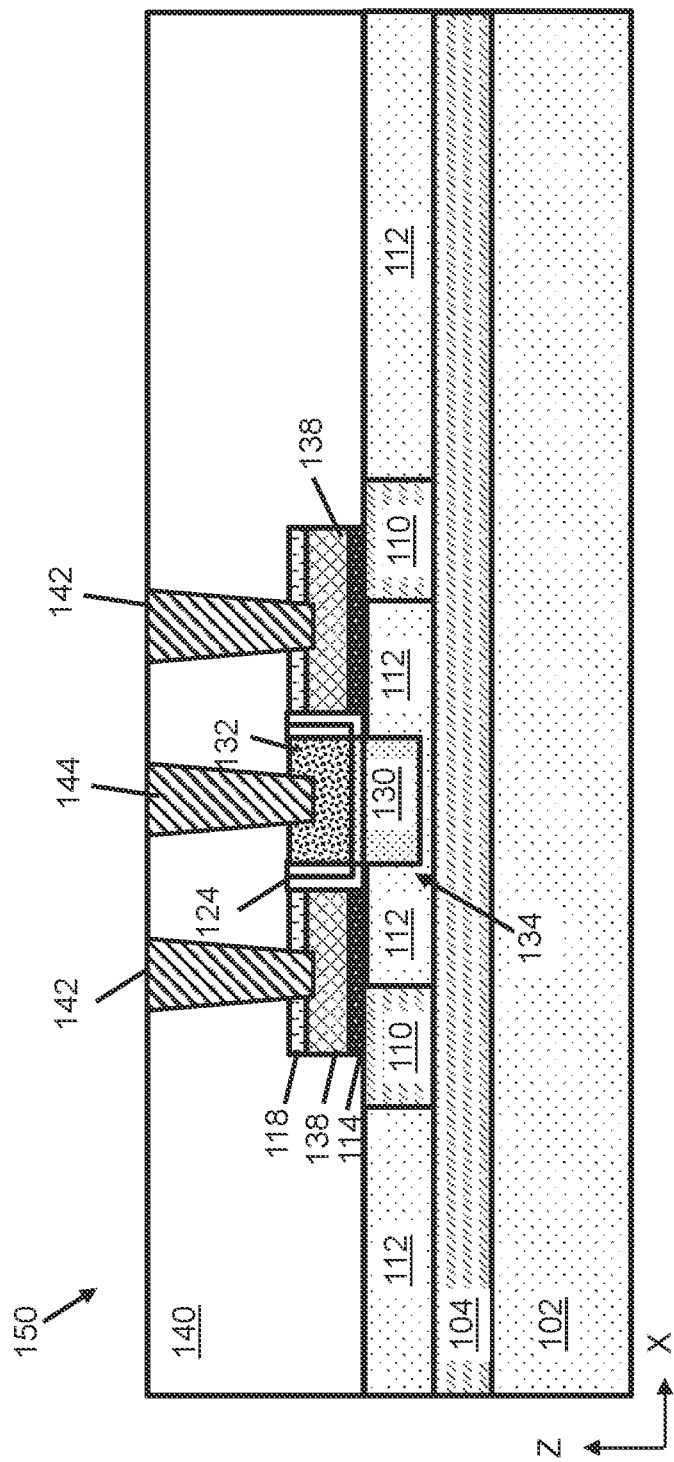
FIG. 9 depicts a cross-sectional view of a lateral bipolar transistor structure according to embodiments of the disclosure.

FIG. 9 depicts the forming of an inter-level dielectric (ILD) layer 140 above semiconductor layer(s) 112, TI(s) 110, and the previously formed components over semiconductor layer(s) 112 and TI(s) 110. ILD layer 140 may be formed, e.g., by deposition or other techniques of forming an insulative material on a structure. ILD layer 140 may include the same insulating material as TI(s) 110 or may include a different electrically insulative material. ILD layer 140 and TI(s) 110 nonetheless constitute different components, e.g., due to TI(s) 110 being formed within and alongside portions of semiconductor layer 112 instead of being formed thereon. In further embodiments (not shown), a silicide layer as known in the art could be formed on upper surfaces of base structure 134 and raised E/C terminals 138 prior to ILD layer 140 deposition. For example, a Co, Ti, NI, Pt, or similar self-aligned silicide (silicide) could be formed prior to ILD layer 140 deposition. Additional metallization layers (not shown) may be formed on ILD layer 140 during middle-of-line and/or back-end-of-line processing. To electrically couple various components discussed herein to such metallization layers, a set of E/C contacts 142 may be formed on raised E/C terminals 138 and within ILD 140. Portions of insulative cap(s) 118 on the upper surface of raised E/C terminals 138 be removed by vertical etching (e.g., by RIE) as E/C contacts 142 are formed, while other portions of insulative cap(s) 118 may remain intact. Similarly, a set (i.e., one or more) base contacts 144 may be formed on extrinsic base 132 and within ILD 140.

One or more of contacts 142, 144 to overlying circuit elements may be formed within predetermined portions of ILD layer 140 by a controlled amount of vertical etching to form openings to one or more contact sites, and then filling the openings with a conductor. Each contact 142, 144 may include any currently known or later developed conductive material configured for use in an electrical contact, e.g., tungsten (W), copper (Cu), aluminum (Al), gold (Au), etc. Contacts 142, 144 may additionally include refractory metal liners (not shown) positioned alongside ILD layer 140 to prevent electromigration degradation, shorting to other components, etc. As discussed herein, selected portions of extrinsic base 132 and/or raised E/C terminals 138 may include silicide regions (i.e., portions of semiconductor that are annealed in the presence of an overlying conductor) to increase the electrical conductivity at their physical interface with contact(s) 142, 144, where applicable.

Figure 10:
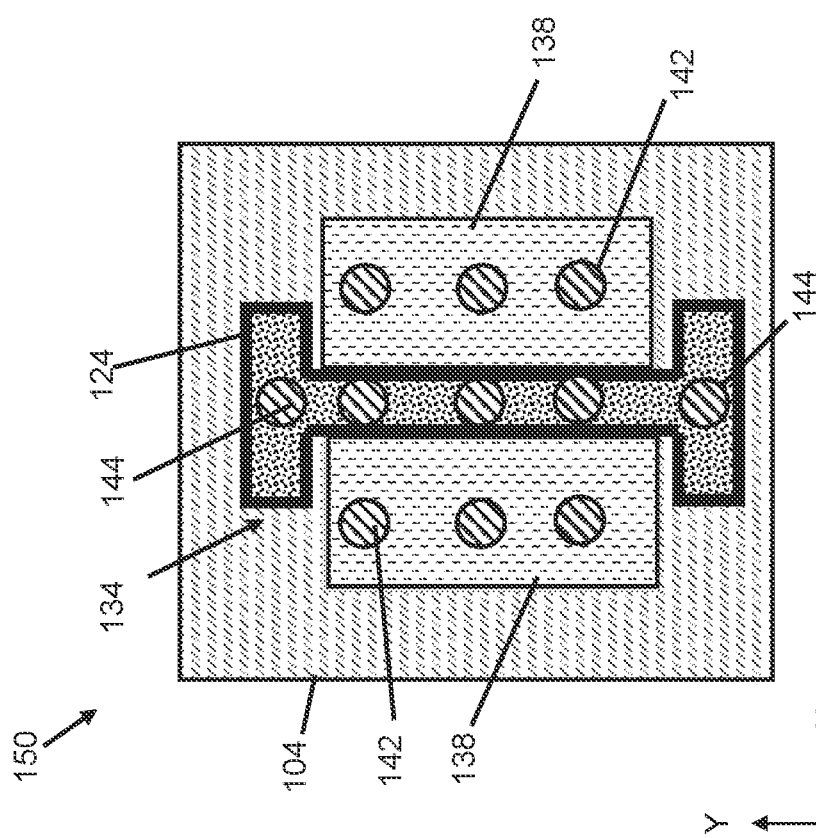
FIG. 10 depicts a plan view of a lateral bipolar transistor structure according to embodiments of the disclosure.

Referring to FIGS. 9 and 10, in which FIG. 10 provides a plan view, embodiments of the disclosure provide a lateral bipolar transistor structure 150 in which marker layers 114 remain intact as active portions of the active emitter and collector terminals. Marker layers 114 are unlike conventional etch stop materials for controlling etch depth in that they are formed of semiconductor material and may be embedded within a bipolar transistor. Marker layers 114 thus may include active semiconductor materials (e.g., SiGe with various amounts of Ge concentration) and thus allow P-N junctions to form unimpeded between base structure 134 and adjacent portions of semiconductor layer 112. Additionally, it is emphasized that a portion of semiconductor layer 112 may be located below intrinsic base 130 of lateral bipolar transistor structure 150. The boundary between intrinsic base 130 and semiconductor layer 112 may be detected, e.g., based on the material composition of each material (e.g., where semiconductor layer 112 includes Si and intrinsic base 130 includes SiGe).

Lateral bipolar transistor structure 150 may include semiconductor layer 112 over insulator layer 104. Portions of intrinsic base 132 within semiconductor layer 112 may have the opposite doping type from other portions of semiconductor layer 112. Marker layer 114 is on semiconductor layer 112 and horizontally separated from base structure 134 via spacer(s) 124. Raised E/C terminals 138 may be on marker layer 114, such that marker layer 114 is vertically between semiconductor layer 112 and raised E/C terminals 138. However, the semiconductor composition of marker layer 114 (e.g., SiGe or other semiconductor materials configured for higher etch selectivity) ensures that P-N junctions will continue to form within active portions of semiconductor layer 112 adjacent base structure 134. As shown in the plan view of FIG. 10, each base structure 134 and raised E/C terminal 138 may have several contacts 142, 144 thereto. Additionally, for lower total base resistance, base structure 134 may extend along a lateral length that is greater than E/C terminal(s) 138 to provide additional surface area for coupling to base contacts 144.

Figure 11:
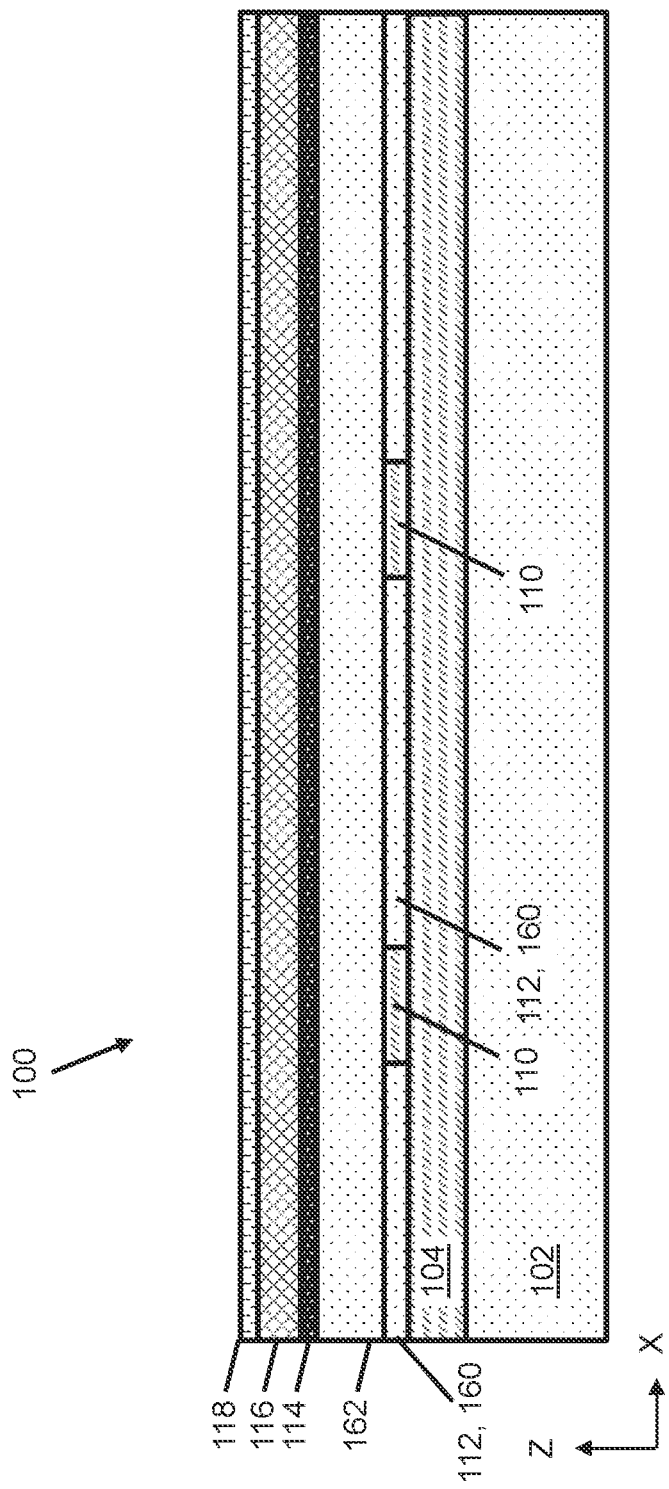
FIG. 11 depicts a cross-sectional view of an initial structure to be processed according to further embodiments of the disclosure.

Referring now to FIG. 11, embodiments of the disclosure are operable to form lateral bipolar transistor structure(s) 150 on thinner types of semiconductor layers. In the example of FIG. 11, buried insulator layer 104 and TI(s) 110 of initial structure 100 may be sized as thin as possible to provide better interaction with overlying semiconductor materials, and in various embodiments may have a total thickness that is at most approximately twenty-five nanometers (nm) above substrate 102. In this case, a "fully depleted semiconductor on insulator" (FDSOI) semiconductor layer 160 may be used as a type of semiconductor layer 112 in an eventual lateral bipolar transistor structure. The use of FDSOI technology provides various advantages such as an adjustable electric transistor potential by applying a bias to substrate 102 to affect the conductivity within semiconductor materials above buried insulator layer 104. Such biasing, in turn, may control the threshold current needed to create an electrical pathway between a bipolar transistor's collector and emitter. In alternative implementations, FDSOI layer 160 may be replaced with another type of layer, e.g., another type SOI layer having any desired thickness.

In the FIG. 11 example, TI(s) 110 and FDSOI layer 160 each may be on buried insulator layer 104. In addition, an intermediate semiconductor layer 162 may be on TI(s) 110 and FDSOI layer 160. Intermediate semiconductor layer 162 may have a same or similar composition to substrate 102 and similar materials discussed herein (e.g., semiconductor layer 112), with a predetermined doping type and/or doping concentration. For example, intermediate semiconductor layer 162 may have a same doping type as raised semiconductor layer 116, but with a lower dopant concentration. Remaining portions of initial structure 100 may be the same as in other examples discussed herein, e.g., marker layer 114 on intermediate semiconductor layer 162, raised semiconductor layer 116 on marker layer 114, and insulator cap 118 on raised semiconductor layer 116.

Figure 12:
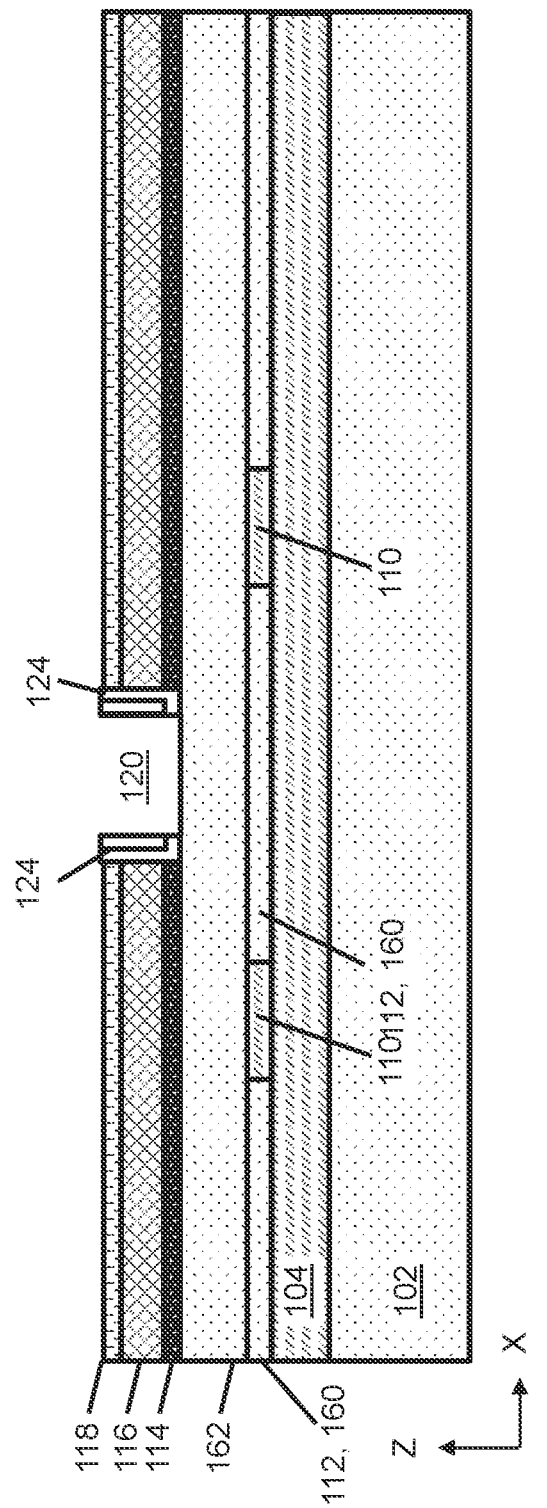
FIG. 12 depicts a cross-sectional view of forming an opening and spacers according to further embodiments of the disclosure.
Figure 13:
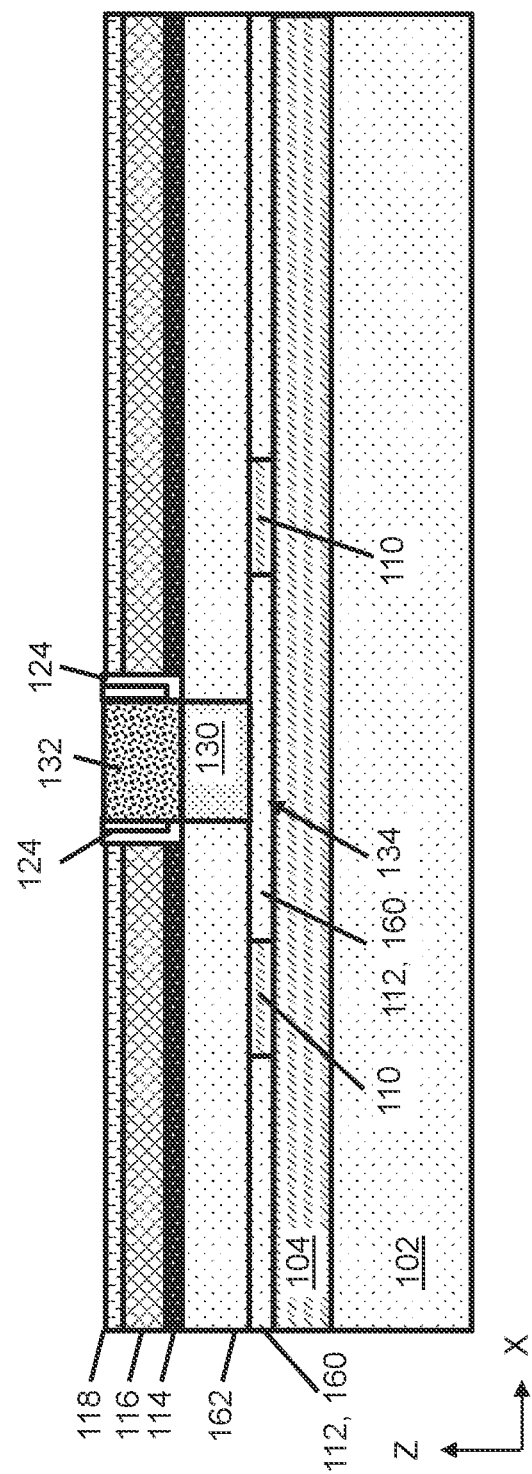
FIG. 13 depicts a cross-sectional view of forming an intrinsic base and an extrinsic base according to further embodiments of the disclosure.
Figure 14:
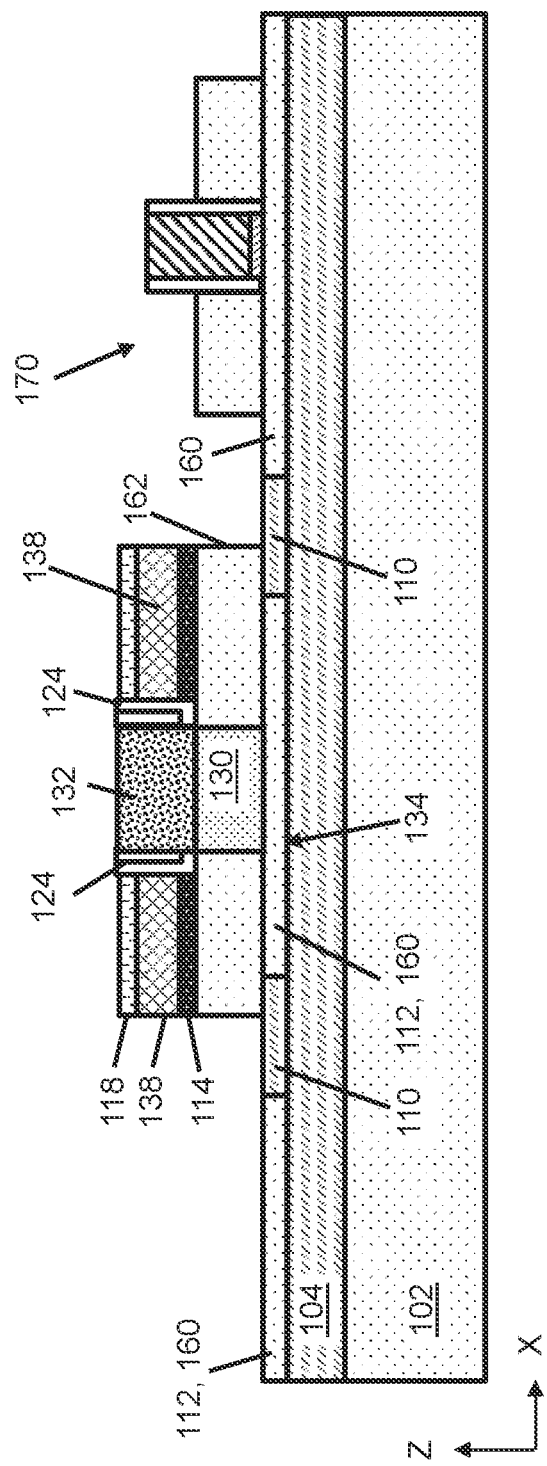
FIG. 14 depicts a cross-sectional view of forming an additional device according to further embodiments of the disclosure.

Turning to FIGS. 12-14, continued processing may be implemented on initial structure 100 (FIG. 11) substantially as described elsewhere herein, despite the presence of FDSOI layer 160 and intermediate semiconductor layer 162. That is, as shown in FIG. 12, opening(s) 120 may be formed through layers 114, 116, insulative cap 118, and spacer(s) 124 may be formed within opening(s) 120 on intermediate semiconductor layer 162. As shown in FIG. 13, base structure 134 can then be formed within opening(s) 120, with intrinsic base 130 being formed on FDSOI layer 162 and within (or alongside) intermediate semiconductor layer 162. Extrinsic base 132 may be formed on intrinsic base 130 and adjacent spacer(s) 124, with an upper surface that is substantially coplanar with the upper surfaces of insulative cap(s) 118 and spacer(s) 124. Thereafter, selected portions of layers, 114, 116, 118 can be removed (e.g., using a combination of masking and etching as discussed herein) to define raised E/C terminals 138 alongside base structure 134.

At this stage, as shown in FIG. 14, embodiments of the disclosure also may include forming one or more additional devices 170 over other portions of substrate 102. An example of device 170 is shown as a field effect transistor (FET) over another portion of FDSOI layer 160 in the example of FIG. 14, but device(s) 170 additionally or alternatively may include resistors, capacitors, other types of bipolar transistors (e.g., vertical bipolar transistors), and/or other structures formed on or from active semiconductor materials. Although device(s) 170 are shown by example as being on FDSOI layer 160, they may be included in any other structure and/or method described herein.

Figure 15:
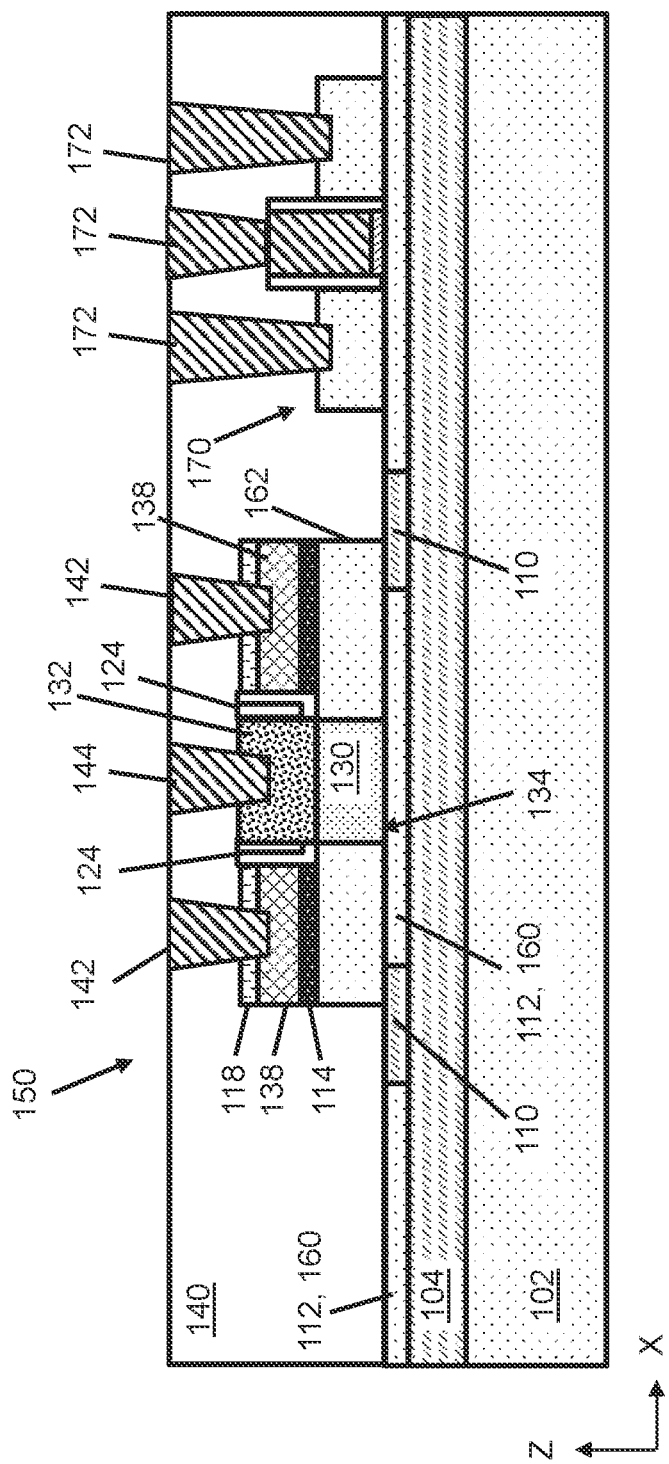
FIG. 15 depicts a cross-sectional view of a lateral bipolar transistor structure according to further embodiments of the disclosure.

As shown in FIG. 15, embodiments of lateral bipolar transistor structure 150 may be on FDSOI layer 160 and horizontally displaced from other device(s) 170 that are also on FDSOI layer 160. In this case, one or more TIs 110 may separate active portions of FDSOI layer 160 for lateral bipolar transistor structure 150 from other portions of FDSOI layer 160 for device(s) 170. Additionally, intermediate semiconductor layer 162 may be adjacent intrinsic base 130 and below marker layer 114. As with other embodiments, the inclusion of semiconductor material(s) in marker layer 114 may allow P-N junctions to form at the physical boundary between intrinsic base 132 and intermediate semiconductor layer 162. The remaining components of lateral bipolar transistor structure 150, including ILD 140 and contacts 142, 144, may be formed in substantially the same manner as other implementations discussed herein. Contact(s) 172 also may be formed to device(s) 170, e.g., in the same processing phase as contact(s) 142, 144.

Figure 16:
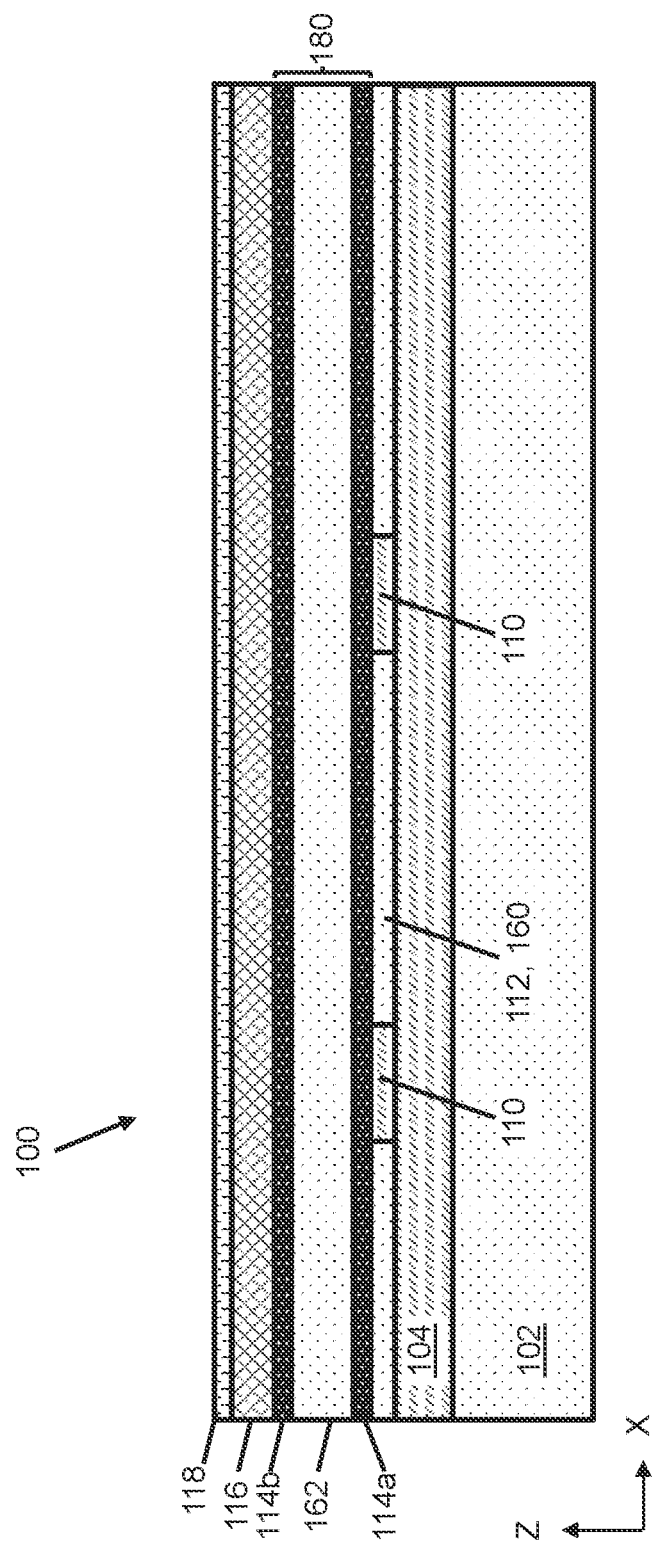
FIG. 16 depicts a cross-sectional view of an initial structure with multiple marker layers according to embodiments of the disclosure.
Figure 17:
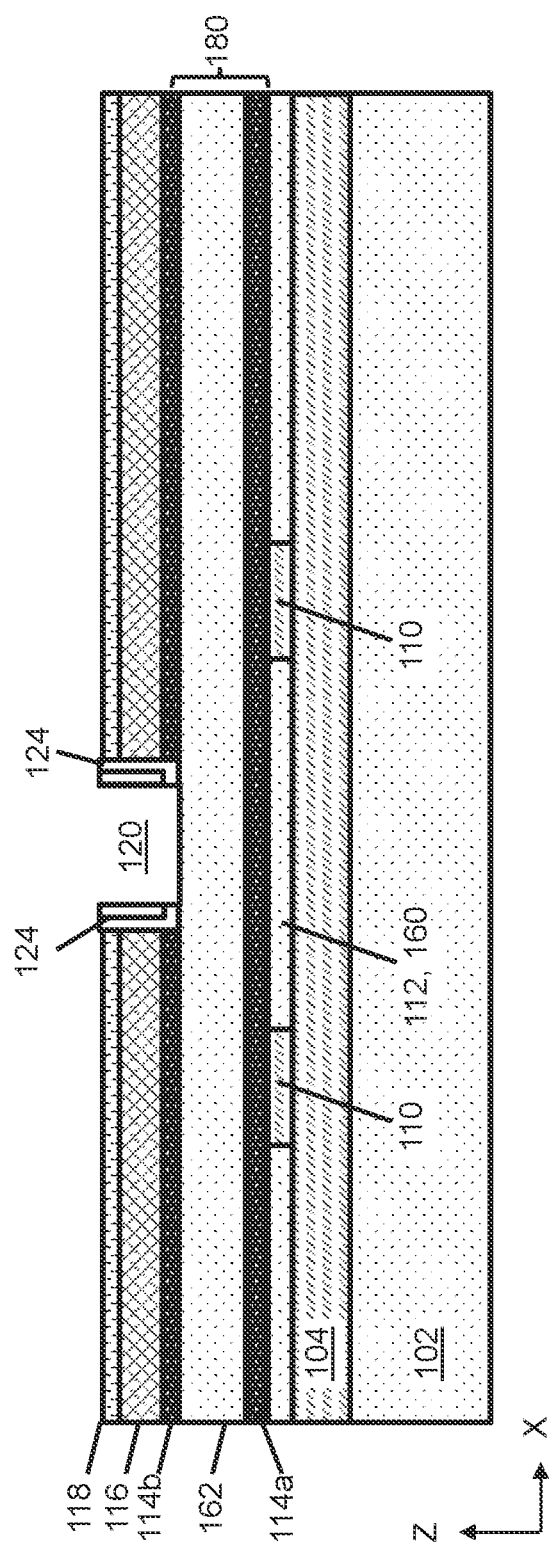
FIG. 17 depicts a cross-sectional view of forming an opening through one marker layer and forming spacers according to further embodiments of the disclosure.

FIGS. 16 and 17 depict a further implementation of initial structure 100, in which a semiconductor stack 180 is vertically between semiconductor layer 112 (or FDSOI layer 160 where applicable) and raised semiconductor layer 116. Semiconductor stack 180 may include multiple marker layers 114a, b alternating with one or more intermediate semiconductor layers 162 therebetween. Each marker layer in semiconductor stack 180 in FIGS. 16 and 17 is separately identified as marker layers 114a, 114b, respectively. In further implementations, semiconductor stack 180 may include more than two marker layers 114 and more than two intermediate semiconductor layers 162. The use of semiconductor stack 180 with multiple marker layers 114 may allow active semiconductor materials therein to have several doping types and/or dopant concentrations. These multiple doping types and/or dopant concentrations thus can be included within the eventual E/C terminals of lateral bipolar transistor structure 150. Opening(s) 120 may be formed within raised semiconductor layer 116 and insulator cap 118, with spacer(s) 124 being formed within opening(s) 120. In subsequent processing, portions of semiconductor stack 180 below opening 120 can be removed or doped to form intrinsic base 132 and/or extrinsic base 134.

Figure 18:
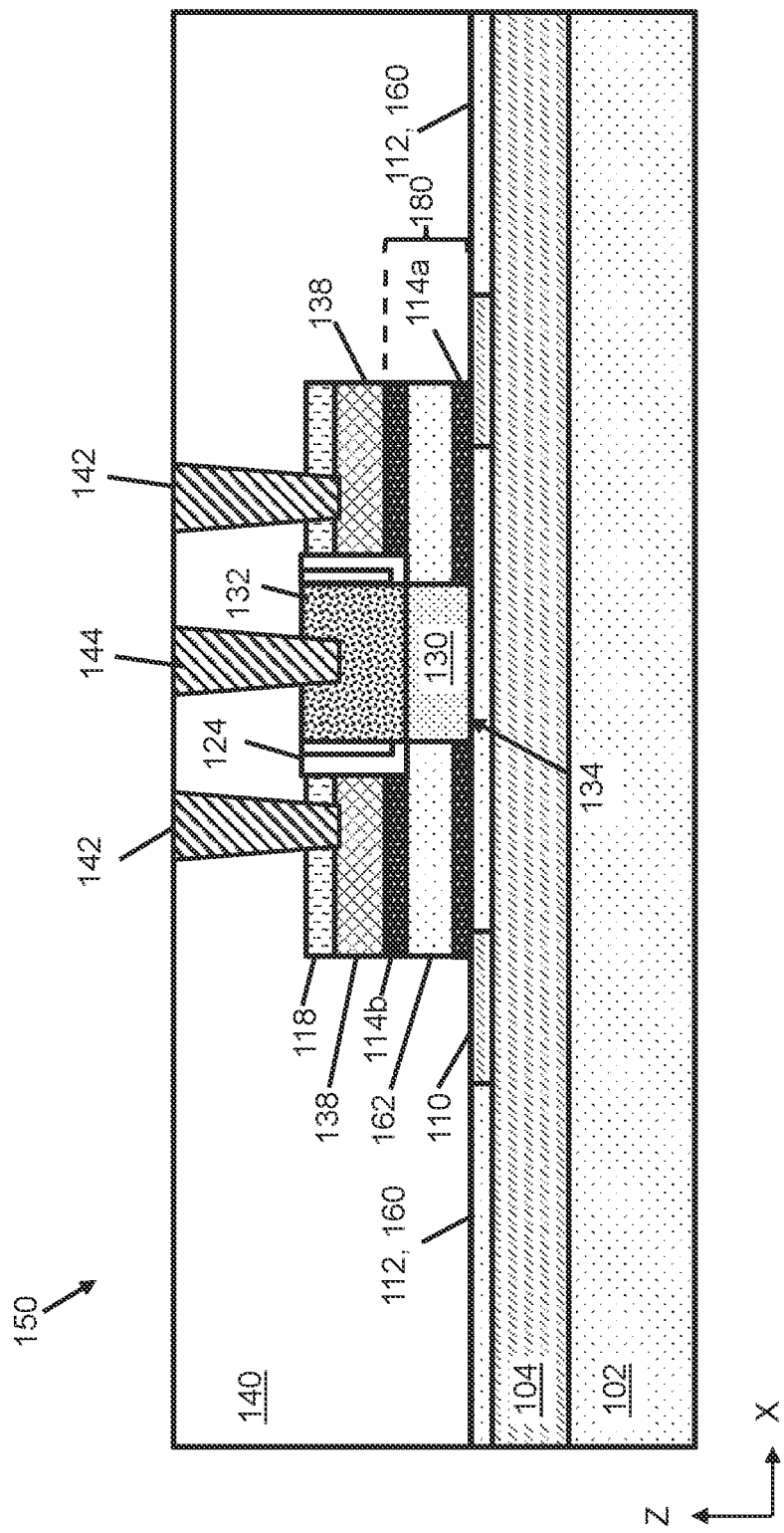
FIG. 18 depicts a cross-sectional view of a lateral bipolar transistor structure with multiple marker layers according to embodiments of the disclosure.

FIG. 18 depicts lateral bipolar transistor structure 150 after forming of raised E/C terminals 138, ILD 140, and contacts 142, 144. Although device 170 (FIGS. 14, 15) is omitted from FIGS. 16-18, it is understood that lateral bipolar transistor structure 150 with semiconductor stack 180 may also be formed horizontally distal to device 170 as discussed herein. In lateral bipolar transistor structure 150, semiconductor stack 180 may be on a portion of semiconductor layer 112 (e.g., FDSOI layer 160 where applicable), with raised E/C terminals 138 being on semiconductor stack 180. Spacer(s) 124 also may be on semiconductor stack 180, such that a boundary between intrinsic base 130 and adjacent portions of semiconductor stack 180 is below spacer(s) 124. As with other implementations described herein, the material composition of marker layers 114a, 114b, etc., of semiconductor stacks 180 may not interfere with the forming of a P-N junction between intrinsic base 130 and adjacent portions of semiconductor stack 180. In some cases, the P-N junction may be partially defined between intrinsic base 130 and one or more of marker layers 114a, 114b, etc.

Embodiments of the disclosure provide various technical and commercial advantages. The use of marker layers allows for precise formation of spacer(s) 124 and base structure(s) 134 to desired dimensions within bipolar transistor 150. Lateral bipolar transistor structures 150 according to the disclosure include electrical properties that are superior to conventional structures, e.g., cut-off frequency ($f_T$), current gain (β), early voltage ($V_A$), etc. Additionally, the position and composition of marker layers 114 in lateral bipolar transistor structure 150 may allow a heterojunction to form between raised E/C terminals 138 and base structure 134 without being impeded by the composition of marker layers 114 (e.g., as compared to insulative etch stop layers). Embodiments of the disclosure are particularly suitable for use in PDSOI and FDSOI technology, where the height of a bipolar transistor relative to other devices or transistors affects operational characteristics and/or manufacturing. Methods according to the disclosure may use an additional mask (e.g., mask 122 (FIGS. 2, 3)) to form and process structure 100 (FIGS. 1, 11, 16), but this is still advantageous when compared with other processing paradigms to form lateral bipolar transistors.

The method and structure as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher-level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a center processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about," "approximately," and "substantially," are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A lateral bipolar transistor structure comprising:
  a semiconductor layer over an insulator layer, the semiconductor layer including:
    an emitter/collector (E/C) region having a first doping type, and
    an intrinsic base region adjacent the E/C region and having a second doping type opposite the first doping type;
  a marker layer on the E/C region of the semiconductor layer, the marker layer including a pair of opposing sidewalls;
  a raised E/C terminal on the marker layer, the raised E/C terminal including a pair of opposing sidewalls substantially vertically aligned with the pair of sidewalls of the marker layer;

an extrinsic base on the intrinsic base region of the semiconductor layer; and a spacer horizontally between the raised E/C terminal and the extrinsic base.

2. The lateral bipolar transistor structure of claim 1, wherein a material composition of the marker layer is configured for etch selectivity to the raised E/C terminal and the E/C region.

3. The lateral bipolar transistor structure of claim 2, wherein the material composition of the marker layer includes silicon germanium (SiGe).

4. The lateral bipolar transistor structure of claim 3, wherein the intrinsic base region includes SiGe, and wherein a germanium concentration of the intrinsic base region is greater than a germanium concentration of the marker layer.

5. The lateral bipolar transistor structure of claim 1, wherein the semiconductor layer includes a semiconductor on insulator (SOI) layer on a buried insulator layer and adjacent a trench isolation (TI).

6. The lateral bipolar transistor structure of claim 1, wherein the marker layer is above a semiconductor on insulator (SOI) layer, and wherein a lower surface of the marker layer is on a portion of the SOI layer and a portion of a trench isolation (TI) adjacent the SOI layer.

7. The lateral bipolar transistor structure of claim 1, wherein the spacer includes an oxide layer horizontally adjacent a nitride layer.

8. A lateral bipolar transistor structure comprising:
a semiconductor on insulator (SOI) layer on a buried insulator layer and adjacent a trench isolation (TI);
a semiconductor stack on a first portion of the SOI layer, the semiconductor stack including a first marker layer, a doped semiconductor layer on the first marker layer, and a second marker layer on the doped semiconductor layer, the first marker layer including a pair of opposing sidewalls;
a raised E/C terminal on the semiconductor stack, the raised E/C terminal including a pair of opposing sidewalls substantially vertically aligned with the pair of sidewalls of the first marker layer;
a base terminal on a second portion of the SOI layer, the base terminal including an intrinsic base region on the SOI layer and an extrinsic base region on the intrinsic base region; and
a spacer horizontally between the raised E/C terminal and the extrinsic base region of the base terminal.

9. The lateral bipolar transistor structure of claim 8, wherein a material composition of the marker layer is configured for etch selectivity to the raised E/C terminal and the SOI layer.

10. The lateral bipolar transistor structure of claim 8, wherein a vertical thickness of the SOI layer is less than a vertical thickness of the doped semiconductor layer of the semiconductor stack.

11. The lateral bipolar transistor structure of claim 8, wherein a horizontal interface between the semiconductor stack and the intrinsic base region of the base terminal is below the spacer.

12. The lateral bipolar transistor structure of claim 8, wherein a portion of the semiconductor stack is over the TI.

13. The lateral bipolar transistor structure of claim 8, wherein a vertical thickness of the E/C terminal is approximately equal to a vertical thickness of the extrinsic base region of the base terminal.

14. The lateral bipolar transistor structure of claim 8, wherein the spacer includes an oxide layer horizontally adjacent a nitride layer.

15. A method of forming a lateral bipolar transistor structure, the method comprising:
forming an emitter/collector (E/C) region having a first doping type in a first portion of a semiconductor layer;
forming an intrinsic base region in a second portion of the semiconductor layer adjacent the E/C region, the intrinsic base region having a second doping type opposite the first doping type;
forming a marker layer including a pair of opposing sidewalls and on the E/C region of the semiconductor layer;
forming a raised E/C terminal including a pair of opposing sidewalls and over the marker layer, wherein the pair of opposing sidewalls of the raised E/C terminal are substantially aligned with the pair of opposing sidewalls of the marker layer;
forming an extrinsic base on the intrinsic base region of the semiconductor layer; and
forming a spacer horizontally between the raised E/C terminal and the extrinsic base.

16. The method of claim 15, wherein forming the marker layer further includes forming a portion of the marker layer on a trench isolation (TI) region adjacent the semiconductor layer.

17. The method of claim 15, wherein forming the intrinsic base region includes forming a semiconductor having the second doping type within an opening of the second portion of the semiconductor layer, the opening having a lower surface that is above a lower surface of the semiconductor layer.

18. The method of claim 15, further comprising forming the semiconductor layer above a semiconductor on insulator (SOI) layer, wherein the first portion of the semiconductor layer is above a portion of the SOI layer and a trench isolation (TI) adjacent the SOI layer.

19. The method of claim 15, further comprising:
forming a doped semiconductor layer on the marker layer; and
forming an additional marker layer on the doped semiconductor layer, wherein forming the raised E/C terminal includes forming the raised E/C terminal on the additional marker layer.

20. The method of claim 15, wherein forming the spacer includes:
forming an oxide layer on one of the opposing sidewalls of the raised E/C terminal; and
forming a nitride layer on a sidewall of the oxide layer opposite the raised E/C terminal, wherein the oxide layer is between the nitride layer and the raised E/C terminal.

* * * * *